United States Patent [19]
Wu et al.

[11] Patent Number: 5,747,381
[45] Date of Patent: May 5, 1998

[54] TECHNIQUE FOR THE REMOVAL OF RESIDUAL SPIN-ON-GLASS (SOG) AFTER FULL SOG ETCHBACK

[75] Inventors: Lin-June Wu, Hsin-Chu; Chen-Hua Douglas Yu, Keeling; Jin-Yuan Lee, Hsin-Chu, all of Taiwan

[73] Assignee: Taiwan Semiconductor Manufacturing Company, Ltd., Hsinchu, Taiwan

[21] Appl. No.: 599,770

[22] Filed: Feb. 12, 1996

[51] Int. Cl.$^6$ .................................. H01L 21/4763
[52] U.S. Cl. .................. 438/624; 438/699; 438/697; 438/763; 438/626; 438/632
[58] Field of Search .................. 437/195, 231, 437/238; 438/624, 699, 697, 763, 626, 632

[56] References Cited

U.S. PATENT DOCUMENTS

| | | |
|---|---|---|
| 5,192,697 | 3/1993 | Leong .......................... 437/37 |
| 5,328,871 | 7/1994 | Tanigawa et al. ............ 437/231 |
| 5,459,105 | 10/1995 | Matsuura ...................... 437/228 |

Primary Examiner—Charles L. Bowers, Jr.
Assistant Examiner—Lynne A. Gurley
Attorney, Agent, or Firm—George O. Saile; Stephen B. Ackerman

[57] ABSTRACT

This invention relates to a method for removing residual spin-on-glass (SOG) during a planarization processing step wherein the SOG is used as a sacrificial planarization medium and subjected to a full etchback to an underlying interlevel dielectric (ILD) layer. The SOG is applied over the ILD layer, and etched back into the ILD layer by reactive-ion-etching under conditions of comparable etch rates for both SOG and ILD. At endpoint there some residual pockets of SOG can be present as well as a region of SOG along the edges of the wafer where it is clamped in the etchback tool. The residual SOG must be removed completely to avoid SOG cracking after thermal processing and SOG outgassing during subsequent metal deposition. For this purpose an aqueous etch consisting of hydrofluoric acid buffered with ammonium fluoride is used. The etchant composition chosen exhibits a selectivity for SOG over the ILD glass of greater than 40 making it suitable for removing considerable SOG residues with minimal attack of the ILD.

21 Claims, 4 Drawing Sheets

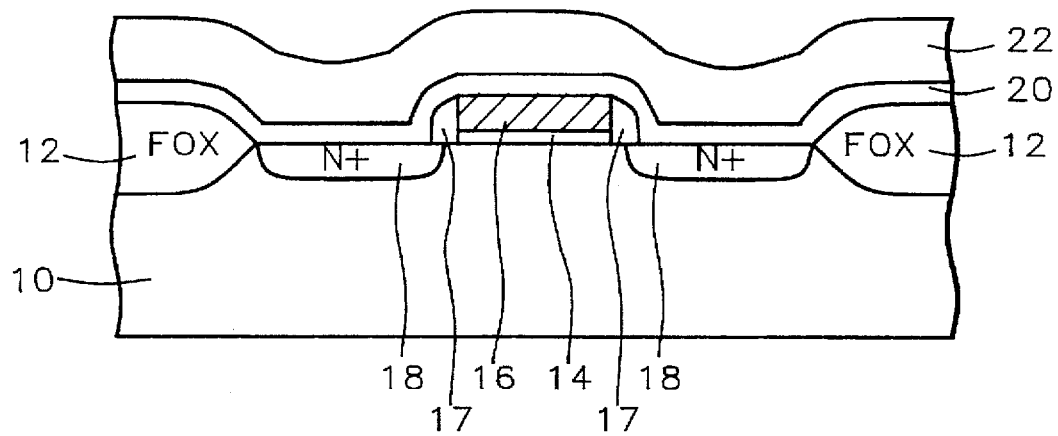
*FIG. 1 - Prior Art*
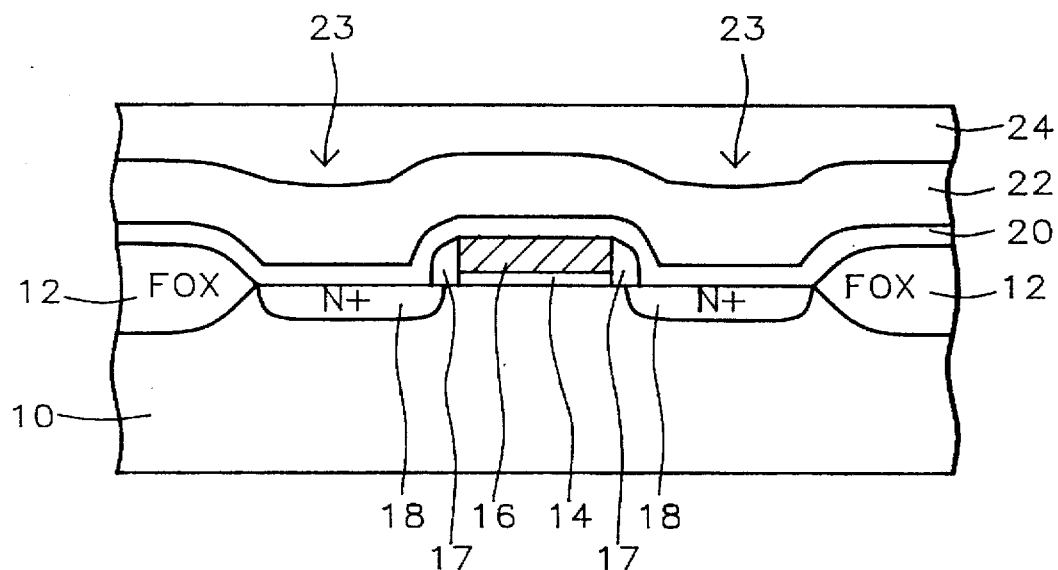
*FIG. 2 - Prior Art*

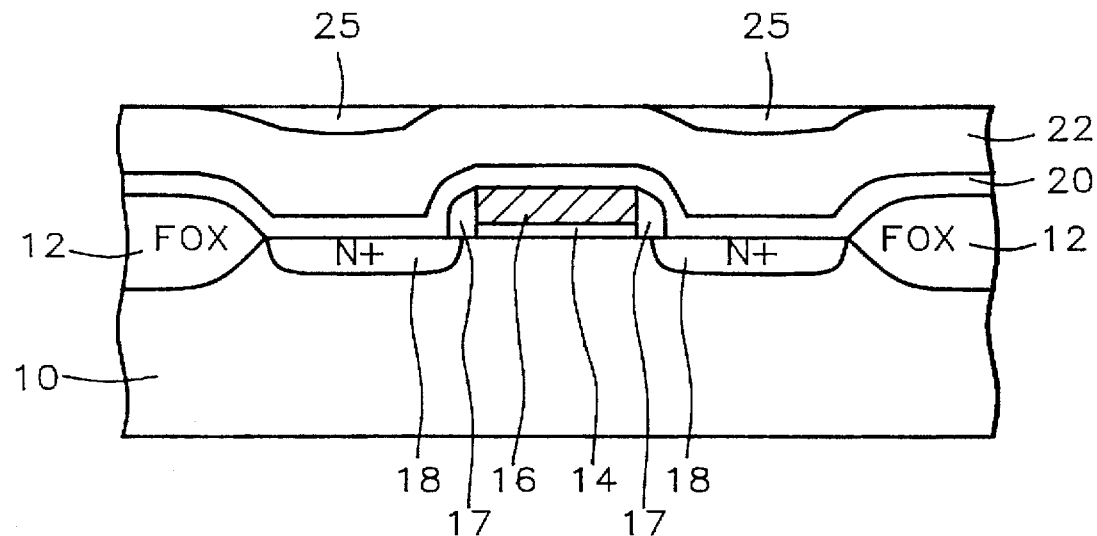
FIG. 3 - Prior Art
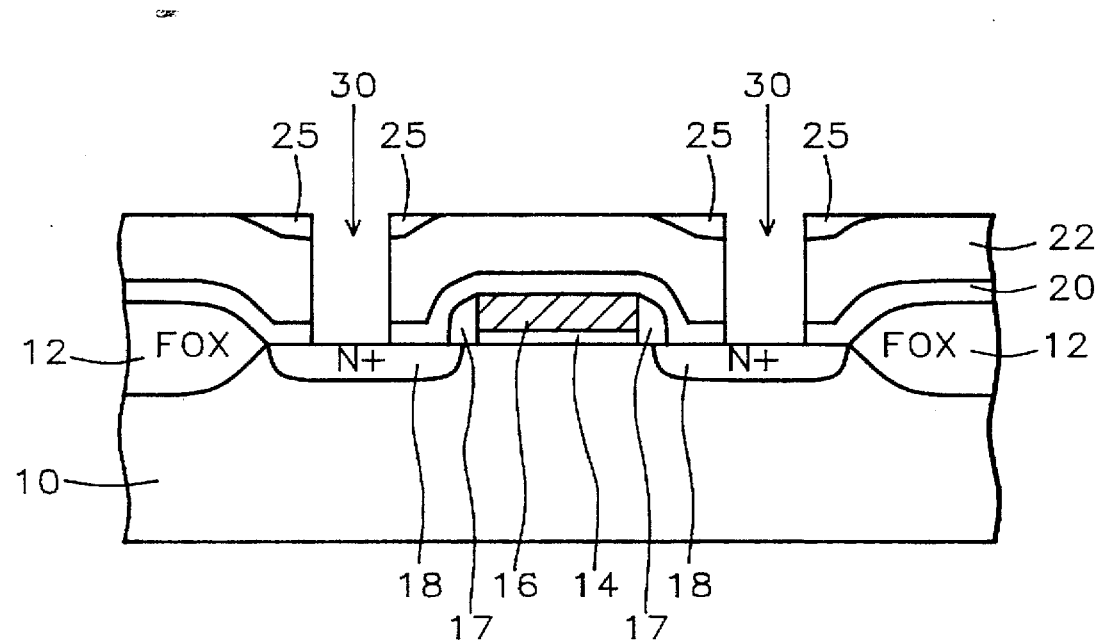
FIG. 4 - Prior Art

TECHNIQUE FOR THE REMOVAL OF RESIDUAL SPIN-ON-GLASS (SOG) AFTER FULL SOG ETCHBACK

BACKGROUND OF THE INVENTION (1) Field of the Invention

This invention relates to the manufacture of integrated circuit devices and more particularly to application and processing of spin-on-glasses.

(2) Description of Prior Art

The manufacture of large scale integrated circuits in a mass production facility involves a sequence of discrete processing steps beginning with the introduction of blank semiconductor wafers at one end and recovering the completed chips at the other. The manufacturing process is usually conceived as consisting of two segments The first is often referred to as front-end-of-line (FEOL) processing and includes those processing steps wherein the semiconductor devices are formed within the silicon surface. The second segment called back-end-of-line (BEOL) processing encompasses the formation of the various layers of interconnection metallurgy above the silicon surface. Depending on the complexity of the product and the circuit design as many as four layers of metallurgy may be required to provide the required circuit interconnections and connecting pads for the chips external connections.

The processing steps in BEOL involve depositing layers of material, patterning them by photolithographic techniques, and etching away the unwanted portions. The materials consist primarily of insulators and metal alloys.

Each time a layer of metallization is applied and circuit paths are etched within it, the next layer of insulation is preferred to flow into the contours of the metal pattern it is covering and to render a smooth planar surface for the next metal layer. Most traditional film deposition techniques such as chemical-vapor-deposition (CVD) and rf sputtering cannot provide this desired surface planarization. These processes are more or less conformal and thereby replicate the topography upon which they are deposited. Only materials which can experience liquid flow are able to provide a planar upper surface. To this end low melting point glasses such as phosphosilicate glass (PSG) and borophosphosilicate glass (BPSG) can be deposited by CVD and caused to flow at elevated temperatures. BPSG formed by the thermal decomposition of tetraethyl orthosilicate (TEOS) in the presence of boron and phosphorous dopant sources, is generally favored for planarization purposes over BPSG formed using a silane based CVD process. This glass is often referred to as BPTEOS. Because of the temperatures required for adequate flow, these glasses, although utilized for higher levels of ILD (InterLevel-Dielectric), are usually flowed only prior to the first layer of metallization.

Other alternatives comprise materials that can be applied in liquid form and subsequently hardened or cured to form solid insulating layers. In this category are photoresists, polyimides, and spin-on-glasses (SOG). The photoresists and polyimides remain as hardened organic materials after curing. The SOGs consist of alcohol soluble silicates and siloxanes and can attain the properties of inorganic glasses when properly cured. Curing is commonly done by convection heating or by subjecting the coating to ultraviolet light at an elevated temperature. Curing by implanting argon ions into the layer has also been reported by Leong U.S. Pat. No. 5,192,697. Once cured the SOG layers exhibit properties approaching those of silicon oxide. The SOGs have Found wide acceptance in recent sub-micron semiconductor processing technology because of their low defect density, simplified processing, and low thermal budget. However, the SOG layers are limited to thicknesses of only a few thousand Angstroms and generally require several applications. Thicker layers tend to crack especially when subjected to thermal stresses caused by subsequent rapid thermal annealing (RTA).

A common method of usage is to first deposit a layer of CVD silicon oxide over the silicon wafer and then depositing the liquid SOG over it with a standard photoresist spinner. The SOG fills in around the topographic features. It is then etched back by anisotropic etching to the CVD oxide. The result is the original CVD layer with the small spacings filled with SOG. An additional layer of CVD silicon oxide is then applied to seal in the SOG and complete the ILD sandwich structure.

Another method utilizes the SOG entirely as a sacrificial etchback layer. Here the underlying oxide or glass layer is made somewhat thicker than the final desired ILD thickness. SOG is applied over the glass layer and the etchback is performed using reactive-ion-etching (RIE) under conditions that etch the SOG at the same rate as the glass layer. The SOG provides the required surface planarity. When the etchback reaches the glass layer, the etching is continued into the glass layer until the etched surface reaches the base of the SOG in the pockets. Since the etch rates are comparable, planarity is maintained. This eliminates the need for an additional layer of glass to seal in any remnant SOG. However, the process window of the over-etching is limited by the design layout of the wafer. In order to avoid excessive over-etching in one region, the over-etching in another region may be so restricted as to be borderline. The result is that shallow pockets of SOG can remain in some regions of the wafer.

The SOG is deposited by a nozzle directed at the center of a rapidly spinning wafer. Centrifugal force distributes the liquid over the wafer. Excess liquid is flung from the edge of the wafer. The wafer is then partially baked to drive out the solvents and re-coated, sometimes with several coats.

During the SOG sacrificial etchback, the wafer is held by a clamp which extends between 2 and 3 mm in from the edge and also covers the flat edge. The area covered by the hold down clamp is shown by the shaded portion 50 in FIG. 7B. Any SOG within this shaded region will remain after the RIE procedure. A prior art solution to this problem provides an edge rinse with isopropyl alcohol (IPA) before the SOG is cured. Referring to FIG. 7A, a jet of IPA is administered to the edge of the spinning wafer and a band of SOG 40 along the circular portion of the wafer is removed. However, the jet does not contact the SOG along the flat edge 42 of the wafer. This portion 60 (FIG. 7C) is also covered by the hold down clamp and therefore remains after the RIE etch back.

In the process variation where the SOG is fully etched back into the underlying ILD without providing an additional layer of oxide to seal the SOG, a means must be provided to selectively remove any residual SOC prior to elevated temperature processing such as impurity activation. Failure to do so results in SOG cracking with subsequent particulate contamination. Even a sealed SOG process is subject to cracking during subsequent high temperature processing. In addition to the danger of particulate contamination during the anneal, a further problem is presented by exposed residual SOG. This material can outgas during the deposition of a metallization layer resulting in a poisoning of metallization contacts. The result is high contact resistance. Siloxane based SOGs are particularly prone to this problem.

SUMMARY OF THE INVENTION

Accordingly, this invention teaches the use of an aqueous etchant consisting of hydrofluoric acid buffered with ammonium fluoride to selectively remove regions of SOG which remain on the wafer after the RIE planarization. This etchant is prepared to achieve a high selectivity of SOG etch rate over the etch rate of the ILD glass which it planarizes. By using a 10:1 solution of buffered HF an etch rate ratio of greater than 40 can be achieved. Thus, for example, a region of SOG 3,000 Angstroms thick could be removed at the expense of only 75 Angstroms of the neighboring ILD glass. The selectivity of dilute hydrofluoric acid alone is less than 3 which is unacceptable.

The buffered HF dip etch is performed immediately after the SOG etchback operation and requires only about 15 to 30 seconds with the etchant at room temperature. The performance of this brief isotropic etch step can guarantee that every vestige of residual SOG is removed.

BRIEF DESCRIPTION OF THE DRAWINGS

FIG. 1 through 3 are cross sections illustrating prior art processing steps leading to the implementation of this invention.

FIG. 4 is a cross section of a prior art procedure for forming contact openings subsequent to the processing depicted by FIG. 1 through FIG. 3.

DESCRIPTION OF THE PREFERRED EMBODIMENTS

Figure 5:
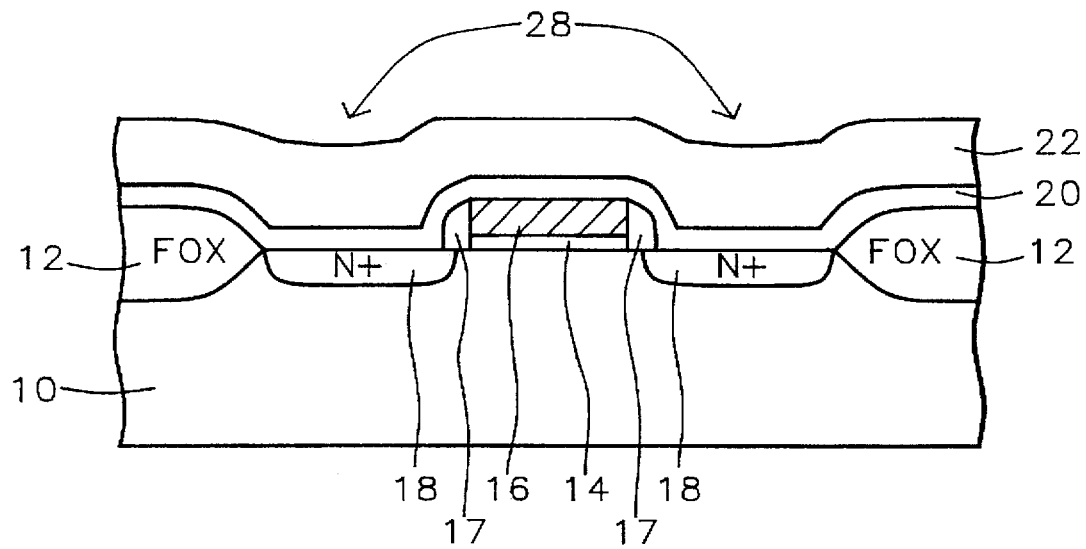
FIG. 5 and 6 are cross sections depicting the steps for forming contact openings subsequent to the processing depicted by FIG. 1 through FIG. 3 utilizing the embodiment of this invention.

Accordingly, in a typical embodiment of this invention, a p-type silicon wafer substrate is provided. Referring to FIG. 1, the wafer 10, at the insertion of this invention, has been processed in an integrated circuit manufacturing line to a point where discrete semiconductor devices have been incorporated. The field isolation regions (FOX) 12 surround an n-channel self-aligned gate MOSFET. The polysilicon gate 16 with silicon oxide sidewalls 17, overlies the gate oxide 14. The source and drain regions 18 lie on either side of the channel region which is below the gate oxide 14.

A composite ILD layer 20 and 22 is deposited by atmospheric-pressure-CVD (APCVD). The first 2,000 Angstroms of the layer 20 are deposited from TEOS alone. This is followed by a 9,000 Angstrom layer 22 using boron- and phosphorous-doped TEOS. The result is a layer of BPTEOS glass 22 over a thinner layer of silicon oxide 20. The layers are deposited at temperatures between 400° C. and 450° C.

As deposited, the BPTEOS layer is nearly conformal and thus its upper surface replicates the topography of the surface below. Subjecting the wafer to an anneal at between 800° C. and 900° C. causes the BPTEOS to flow and thus partially planarize its surface. This planarization is shown by the shallower depressions 23 in FIG. 2.

Referring to FIG. 2, a layer of spin-on-glass (SOG) 24, between 2,000 and 6,000 Angstroms thick, is applied using a commercial wafer spinning apparatus with an adjustable spin rate and a dispensing nozzle located above the wafer center. The product used for this embodiment is a siloxane dissolved in an alcohol based solvent manufactured by Allied Signal Corporation, Morristown, N.J., 07960, Tel: 201-455-2000, under the trade name of 314. The application procedure consists of applying the SOG solution at a predetermined spin rate; removing the wafer and placing it to bake successively on three hot plates set at 100° C., 160° C. and 250° C. for about one minute on each. This procedure gradually drives out the solvent and performs a partial curing. Then a next coat is applied and baked. Each coat consists of about 1,000 to 3,000 Angstroms of SOG. Typically, only a single coat of SOG is applied resulting in an overall SOG layer thickness of about 3,000 Angstroms.

Figure 7A:
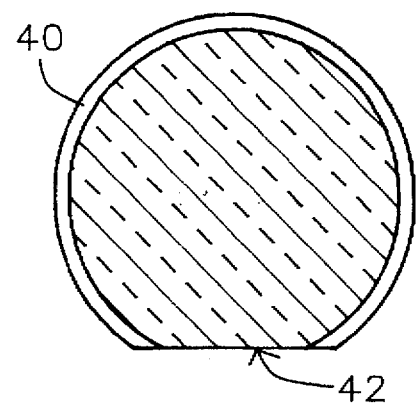
FIG. 7A through 7C show the surface of a wafer at various stages of SOG removal.
Figure 7B:
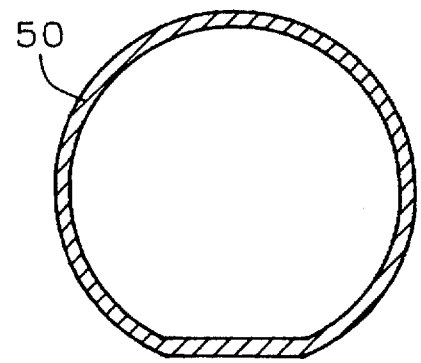

After the final coat has been applied the wafer is subjected to an edge rinse in isopropyl alcohol to remove SOG along the circular wafer edges 40 in the prior art manner previously described and illustrated in FIG. 7B. The completed SOG layer is then finish-cured by a bake in a furnace at approximately 420° C. in a nitrogen ambient.

As is illustrated in FIG. 2, The liquid 24 fills in the underlying topology including the depressions 23, so that its upper surface is essentially planar. As applied, the overall thickness of the SOG layer is uniform across the wafer but tends to be slightly thinner toward the edge.

After the SOG layer has been cured, the wafer is mounted in an RIE tool for the planarization etchback of the SOG. A carrier gas containing tetrafluoromethane ($CF_4$) is used to etch the SOG layer 24 back and into the BPTEOS ILD layer 22. By adjusting the conditions of the rf plasma, the substrate temperature, the gas flow and composition, etch rates for the SOG and the ILD layer can be made comparable. This practice is well known to those skilled in the art of RIE.

Endpoint detection is critical in this step to control the amount of over-etch. The endpoint of the SOG etchback is determined by optical emission spectroscopy utilizing the amplitude of the carbon monoxide signal at 482.5 nm to indicate the disappearance of SOG components from the plasma.

After removal of the wafer from the RIE tool, the ILD layer is shown in FIG. 3. Shallow pockets of SOG 25 reside in areas where the deepest depressions in the original surface occurred. FIG. 3 shows an example of these pockets occurring in a region where contact openings are subsequently etched into the ILD. FIG. 4 shows the structure after the contact openings 30 have been patterned and formed through the BPTEOS layer by the prior art process, leaving remnant SOG deposits 25 at the top of the openings 30. Subsequent RTA processing causes cracking of the remnant SOG 25 which can result in particulates. In addition, the SOG can outgas during contact formation causing increased contact resistance.

Figure 7C:
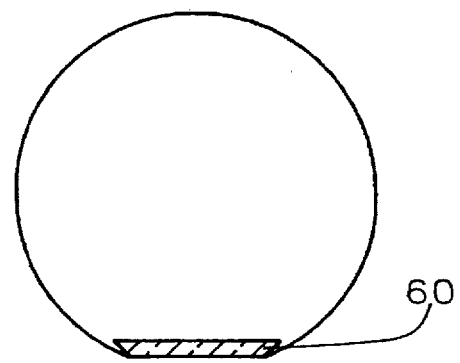

In the this embodiment a dip etch in a buffered HF solution, chosen for its high selectivity of SOG over BPTEOS glass, is performed to remove the SOG from the pockets 25 of FIG. 3, as well as from the wafer flat area 60 (FIG. 7C) which was shielded from the RIE by the wafer clamp.

Table I gives the etch rate of SOG and the BPTEOS glass for several etchant preparations. The composition of the etchants is given in the first column as a ratio of dilution of the HF by volume. The 50:1 dilute HF consists of 50 parts by volume of deionized water to 1 part by volume of concentrated (49 wt. %, 28.3 molar) hydrofluoric acid. The buffered HF compositions are 50 and 10 parts by volume respectively of 40% (12.75 molar) ammonium fluoride to 1 part concentrated (49 wt. % 28.3 molar) hydrofluoric acid.

TABLE I

Etch Rates of various etchants

| Etchant | SOG (Å/min) | ILD (Å/min) | Selectivity |
|---------|-------------|-------------|-------------|
| HF 10:1 | 1,487 | 579 | 2.57 |
| BHF 50:1 | 2,906 | 171 | 17. |
| BHF 10:1 | >33,000 | 742 | >40. |

The selectivity, which is defined as the ratio of the etch rate of the SOG to BPTEOS glass, is given in the last column of the table. Clearly the NH$_4$F buffering has a pronounced effect on the etch rates. The addition of NH$_4$F to dilute hydrofluoric acid raises its pH and also increases the concentration of HF$_2^-$ ion. The concentration of the HF species is correspondingly decreased. This suggests an important role of the HF$_2^-$ ion in the observed selectivity high for SOG over BPTEOS glass. The etchant preferred for this embodiment is 10:1 buffered HF, having a selectivity of greater than 40.

Figure 6:
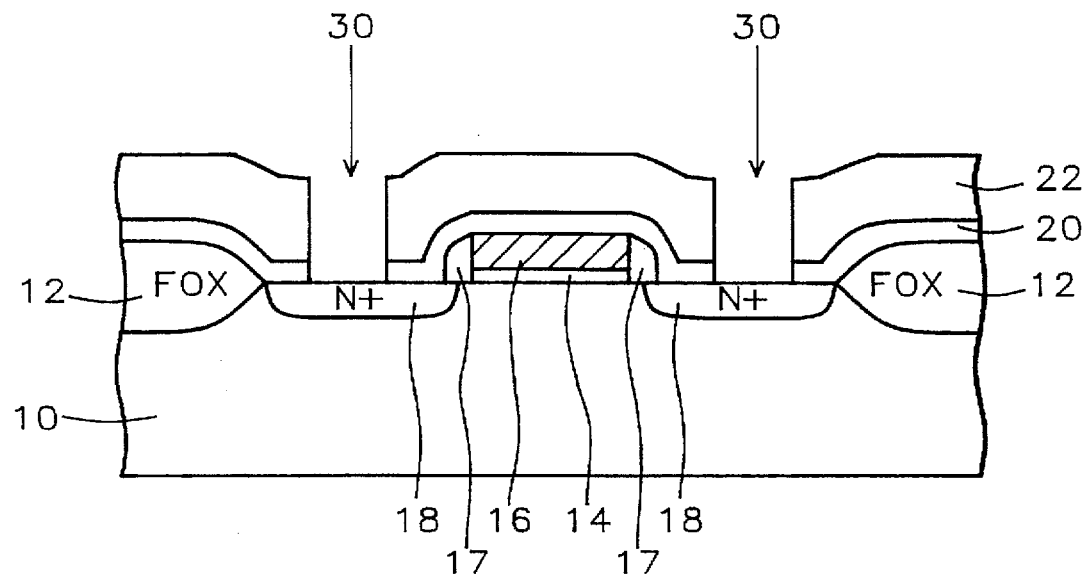

The wafer is given a 15 to 30 second dip in the 10:1 buffered HF etchant at room temperature, rinsed in deionized water, and blown dry. The resulting profile is shown in FIG. 5 where the SOG has been etched away with minimal etching of the ILD leaving behind the pockets 28. The contact openings 30 are then formed in the ILD as shown in FIG. 6. The openings 30 as well as the entire wafer surface are free of SOG. The high temperature steps which accompany the formation of the contacts such as rapid thermal annealing at 925° C. can now be performed without risk of SOG cracking or outgassing.

While this invention has been particularly shown and described with reference to the preferred embodiments thereof, it will be understood by those skilled in the art that various changes in form and details may be made without departing from the spirit and scope of the invention.

The embodiment of FIGS. 1 through 6 used a p-type substrate. It should be well understood by those skilled in the art that n-type substrate conductivities may also be used. It should be further understood that the substrate conductivity type as referred to here does not necessarily refer to the conductivity of the starting wafer but could also be the conductivity of a diffused region within a wafer wherein a field oxide is to be incorporated.

What is claimed is:

1. A method for removing residual spin-on-glass (SOG) from a layer of dielectric material deposited on a substrate comprising:
   providing a substrate covered with a layer of dielectric material having residual areas of SOG on its surface said residual areas of SOG resulting from an anisotropic etch of said SOG; and
   etching said residual areas with an aqueous etchant.

2. The method of claim 1 wherein said dielectric material is chosen from the group consisting of silicon oxide, a phosphosilicate glass, and a borophosphosilicate glass.

3. The method of claim 1 wherein said SOG is selected from the group consisting of a silicate, and a siloxane.

4. The method of claim 1 wherein said selective aqueous etchant is hydrofluoric acid buffered with ammonium fluoride.

5. The method of claim 4 wherein the composition of said hydrofluoric acid buffered with ammonium fluoride is 10 parts or thereabout by volume of 40% (12.75 molar) ammonium fluoride and 1 part or thereabout by volume of concentrated (49 wt. %, 28.3 molar) hydrofluoric acid.

6. The method of claim 4 wherein the selectivity of said hydrofluoric acid buffered with ammonium fluoride for SOG over ILD is determined by the concentration of HF$_2^-$ in said aqueous etchant.

7. A method for removal of residual spin-on-glass (SOG) following a full SOG etchback planarization processing step used in the manufacture of MOSFET integrated circuit devices comprising:
   providing a semiconductor wafer having MOSFET integrated circuit devices formed within its surface;
   depositing a first interlevel dielectric (ILD) layer over said semiconductor wafer;
   depositing a second ILD layer over said first ILD layer;
   depositing a spin-on-glass (SOG) precursor layer over said second ILD layer;
   removing a portion of said SOG precursor layer from the edge of said semiconductor wafer with an organic solvent;
   curing said SOG precursor layer to form a SOG layer;
   etching said SOG layer into said second ILD layer except for a residual area of SOG using an anisotropic etching;
   etching said residual SOG layer from said wafer with an aqueous etchant after said anisotropic etching; depositing a photoresist layer over said wafer;
   patterning said photoresist layer to define contact openings to said semiconductor devices; and
   etching said first ILD layer and said second ILD layer to form contact openings.

8. The method of claim 7 wherein said first ILD layer is silicon oxide deposited by APCVD at a temperature of between about 400° C. to 450° C.

9. The method of claim 7 wherein said second ILD layer is a borophosphosilicate glass formed from silane and nitrous oxide, in the presence of n- and p-type dopant sources.

10. The method of claim 7 wherein said second ILD layer is a borophosphosilicate glass formed from the thermal decomposition of tetraethyl orthosilicate in the presence of n- and p-type dopant sources.

11. The method of claim 10 wherein said second ILD layer is deposited using APCVD at a temperature of between about 400° C. to 450° C.

12. The method of claim 7 wherein the material for the SOG layer is selected from the group consisting of a silicate, and a siloxane.

13. The method of claim 7 wherein said SOG layer is cured by annealing in a furnace at a temperature of between about 380° C. to 460° C. in a nitrogen ambient.

14. The method of claim 7 wherein said SOG layer is cured by radiation of the type selected from the group consisting of UV, deep UV, X-ray, and electron beam.

15. The method of claim 7 wherein the organic solvent is isopropyl alcohol.

16. The method of claim 7 wherein said anisotropic etching is reactive-ion-etching using an etchant gas and conditions to provide comparable etch rates for the SOG layer and the second ILD layer and with a method of end-point-detection to determine when etching should be halted.

17. The method of claim 16 wherein said etchant gas contains tetrafluoromethane.

18. The method of claim 16 wherein the method of endpoint-detection is optical emission spectroscopy using the magnitude of the carbon monoxide signal at 482.5 nm as an indicator of endpoint.

19. The method of claim 7 wherein said aqueous etchant for the removal of said SOG layer is hydrofluoric acid buffered with ammonium fluoride.

20. The method of claim 19 wherein the composition of said hydrofluoric acid buffered with ammonium fluoride is 10 parts or thereabout by volume of 40% (12.75 molar) ammonium fluoride to 1 part or thereabout by volume of concentrated (49 wt. %, 28.3 molar) hydrofluoric acid.

21. The method of claim 19 wherein the selectivity of said hydrofluoric acid buffered with ammonium fluoride for SOG over ILD is determined by the concentration of $HF_2^-$ in said aqueous etchant.

* * * * *